United States Patent
Uematsu et al.

(10) Patent No.: US 7,662,541 B2
(45) Date of Patent: Feb. 16, 2010

(54) PHOTOSENSITIVE RESIN COMPOSITION AND PHOTOSENSITIVE DRY FILM BY THE USE THEREOF

(75) Inventors: Teruhiro Uematsu, Kanagawa (JP); Naoya Katsumata, Kanagawa (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 0 days.

(21) Appl. No.: 11/667,888

(22) PCT Filed: Nov. 22, 2005

(86) PCT No.: PCT/JP2005/021939

§ 371 (c)(1),
(2), (4) Date: May 15, 2007

(87) PCT Pub. No.: WO2006/057423

PCT Pub. Date: Jun. 1, 2006

(65) Prior Publication Data

US 2007/0292804 A1 Dec. 20, 2007

(30) Foreign Application Priority Data

Nov. 25, 2004 (JP) ............................. 2004-340886

(51) Int. Cl.
*G03F 7/031* (2006.01)
(52) U.S. Cl. ............... 430/285.1; 430/288.1; 430/945; 430/281.1; 430/910; 522/26; 522/27
(58) Field of Classification Search ...................... None
See application file for complete search history.

(56) References Cited

U.S. PATENT DOCUMENTS

| | | | |
|---|---|---|---|
| 3,479,185 A | | 11/1969 | Chambers, Jr. |
| 3,873,319 A | * | 3/1975 | Berg ................. 430/273.1 |
| 4,410,621 A | | 10/1983 | Wada et al. |
| 4,657,942 A | | 4/1987 | Iwasaki et al. |
| 5,034,429 A | * | 7/1991 | Kaji et al. ................ 522/12 |
| 6,280,890 B1 | * | 8/2001 | Sawamura et al. ........... 430/7 |
| 2002/0117080 A1 | * | 8/2002 | Okutsu et al. ........... 106/31.78 |
| 2004/0038149 A1 | | 2/2004 | Murakami et al. |
| 2004/0101777 A1 | * | 5/2004 | Kimura et al. ........... 430/270.1 |
| 2004/0157140 A1 | * | 8/2004 | Kamata et al. ................ 430/7 |

FOREIGN PATENT DOCUMENTS

| | | |
|---|---|---|
| EP | 0 107 792 | 5/1984 |
| EP | 0 403 100 | 12/1990 |
| EP | 1031579 A2 * | 8/2000 |
| EP | 1 764 650 | 3/2007 |
| JP | 61172139 | 8/1986 |
| JP | 2002-220409 | 8/2002 |
| JP | 2004198542 | 7/2004 |
| JP | 2004317850 | 11/2004 |
| JP | 2006139136 | 6/2006 |
| WO | WO 01/22165 | 3/2001 |
| WO | 01/71428 | 9/2001 |
| WO | WO-03/072614 A2 * | 9/2003 |
| WO | WO 2004/055596 A1 * | 7/2004 |
| WO | 2006/051761 | 5/2006 |

OTHER PUBLICATIONS

International Search Report for International Application No. PCT/JP2005/021939, date of mailing Jul. 13, 2007.
Notice of Decision of Rejection issued to counterpart Japanese Patent Application No. 2004-340886, mailed Jan. 20, 2009.

* cited by examiner

*Primary Examiner*—Cynthia Hamilton
(74) *Attorney, Agent, or Firm*—Knobbe, Martens, Olson & Bear, LLP

(57) ABSTRACT

A photosensitive resin composition and a photosensitive dry film which are excellent in both sensitivity and stability and are well-balanced in tent strength, resolution and plating non-staining are provided. The photosensitive resin composition comprises an alkali-soluble resin (A), a photopolymerizable compound (B) and a photopolymerization initiator (C), and the polymerization initiator (C) comprises a hexaarylbisimidazole based compound (C1) and a multifunctional thiol compound (C2) as essential components. The photosensitive dry film has at least a photosensitive resin layer formed from the photosensitive resin composition on a support film.

5 Claims, No Drawings

PHOTOSENSITIVE RESIN COMPOSITION AND PHOTOSENSITIVE DRY FILM BY THE USE THEREOF

CROSS-REFERENCE TO RELATED APPLICATION

This application claims priority based on International Patent Application No. PCT/JP2005/021939, entitled "Photosensitive Resin Composition And PhotoSensitive Dry Film By The Use Thereof" by Teruhiro Uematsu and Naoya Katsumata, which claims priority of Japanese Application No. 2004-340886, filed on Nov. 25, 2004, and which was not published in English.

TECHNICAL FIELD

The present invention relates to a photosensitive resin composition and a photosensitive dry film by the use thereof, and in particular relates to a photosensitive resin composition which is also excellent in stability with maintaining sensitivity, and a photosensitive dry film by the use thereof.

BACKGROUND ART

As is well-known, a dry film is used for forming resists for wiring circuit formation in the production of print wiring boards. This dry film is made by at least forming a photosensitive resin layer in a semidried state on a support film.

In a method of using the dry film, first, the photosensitive resin layer is laminated on a material to be treated (substrate) with adding heat. Subsequently, a photo tool is attached firmly onto a support film surface of the photosensitive resin layer, and an area to be cured is cured by exposing with ultraviolet light. Then, after peeling the support film, an unexposed area is removed by developing with a weak alkali aqueous solution to obtain a circuit pattern of a resist. Recently, high-density print wiring substrates have been progressively developed, and thus high sensitivity and high resolution have been required in the dry films used for the production of the print wiring substrates.

A photosensitive resin composition which forms the aforementioned photosensitive resin layer contains a polymer component (A), a photopolymerizable monomer component (B) and a photopolymerization initiator (C) as essential components. As the photosensitive resin composition for the aforementioned dry film, for example, a constitution using an alkali-soluble resin as the polymer component (A), using a common crosslinking compound as the monomer component (B), and using the photopolymerization initiator (C) at 0.1 to 15 parts by weight based on a total 100 parts by weight of the alkali-soluble resin and the crosslinking compound, and using a multifunctional thiol compound (D) having two or more mercapto groups in one molecule at 0.1 to 15 parts by weight based on the total 100 parts by weight of the alkali-soluble resin and the crosslinking compound has been disclosed (e.g., Patent Document 1).

Meanwhile, a laser direct imaging (LDI) technology which requires no photo tool has attracted a lot of attention because many kind of products in small amounts may be efficiently produced with a high degree of accuracy. The laser direct imaging (LDI) technology has also attracted a lot of attention because a production process of the print wiring boards is shortened by omitting production steps because of using no photo mask and it is not necessary to bother the contaminated photo mask. Thus, the suitable photosensitive resin composition obtained using this laser direct imaging (LDI) technology has also been proposed (e.g., Patent Document 2).

Patent Document 1: Japanese Patent Application Laid-Open No. 2002-220409 A

Patent Document 2: Republished WO 01/71428

In laser scanning exposure performed in the above laser direct imaging (LDI) technology, it is preferable that sensitivity of resists is higher in order to increase productivity of the print wiring board because a scanning speed is dependent on the sensitivity of a photosensitive resin composition. However, there is generally a trade-off relationship that stability for light and heat becomes poor when the sensitivity is enhanced in the photosensitive resin composition. Thus, a sensitivity property has been changed by the safety light such as yellow light and the heat generated in the production process of the print wiring board thereby generating a problem of limiting a workability. Therefore, photosensitive resin compositions whose stability for the light and the heat is enhanced with maintaining the high sensitivity has been desired. The photosensitive resin composition disclosed in the above Patent Document 1 has been insufficient in terms of this stability.

A copper through-hole method (tenting method) for obtaining a print wiring plate by forming a circuit pattern of the resist as described above, subsequently etching a copper surface, and peeling a cured resist by a strong alkali aqueous solution such as sodium hydroxide has been a mainstream in methods for producing the print wiring plate because the production process is simple and is easily managed compared with a plating method.

In the pattern formation by this tenting method, higher resolution has been required, and it has been described that it is necessary to thin a photosensitive resin layer of a dry film in order to realize the high resolution. However, when the photosensitive resin layer of the dry film is thinned, there has been a trouble in that no sufficient tent strength is obtained and thus the resist is broken by a developing solution and a washing solution.

That is, in the conventional photosensitive resin compositions, both the sensitivity and the stability for the light and the heat have been seldom satisfied, and further the tent strength and the resolution have been seldom sufficient.

DISCLOSURE OF THE INVENTION

As a result of an extensive study for solving the above problems, the present inventors have found that in a photosensitive resin composition at least having an alkali-soluble resin (A), a photopolymerizable compound (B) and a photopolymerization initiator (C), both sensitivity and stability for exposure light are satisfied and resolution of a resist pattern and tent strength are sufficient when the above photopolymerization initiator (C) has at least a hexaarylbisimidazole based compound (C1) and a multifunctional thiol compound (C2) as essential components. Furthermore, they have found that a contamination property of a plating solution is also low. A "plating contamination property" herein refers to a degree of the contamination by impurities eluted from the resist.

The present inventors have further found that the tent strength is absolutely enhanced by using the above photopolymerizable compound (B) having at least one polymerizable ethylenically unsaturated group in a molecule.

The present invention has been made based on the above findings. That is, the photosensitive resin composition according to the present invention comprising the alkali-soluble resin (A), the photopolymerizable compound (B) and the photopolymerization initiator (C) is characterized in that the above photopolymerization initiator (C) includes at least the hexaarylbisimidazole based compound (C1) and the multifunctional thiol compound (C2) as the essential components.

A photosensitive dry film of the present invention is characterized by having at least a photosensitive resin composition layer formed from the above photosensitive resin composition on a support film. When used, the photosensitive resin layer may be easily provided on a material to be treated (substrate) by lapping the revealing photosensitive resin layer over the material to be treated (substrate), and subsequently peeling the support film from the photosensitive resin layer.

By the use of the photosensitive resin composition of the present invention, the photosensitive resin layer which is excellent in sensitivity and stability and whose properties such as tent strength, resolution and plating non-contamination properties are well-balanced may be formed. Since the photosensitive resin composition of the present invention is excellent in both sensitivity and stability and its properties such as tent strength, resolution and plating non-contamination are well-balanced, it is possible to suitably use as the photosensitive resin composition (photosensitive resin composition for laser scanning exposure) particularly used for laser direct imaging (LDI).

The photosensitive dry film of the present invention is also excellent in both sensitivity and stability, and further is also excellent in various properties such as tent strength, resolution and plating non-contamination. Therefore, it is possible to suitably use as the photosensitive dry film (dry film for laser scanning exposure) used for resist patterning by ultraviolet light exposure, particularly the laser direct imaging (LDI).

BEST MODE(S) FOR CARRYING OUT THE INVENTION

Embodiments of the present invention will be described below.

As described above, the photosensitive resin composition of the present invention comprises an alkali-soluble resin (A), a photopolymerizable compound (B) and a photopolymerization initiator (C), and is characterized in that the above photopolymerization initiator (C) includes at least a hexaarylbisimidazole based compound (C1) and a multifunctional thiol compound (C2) as essential components.

Alkali-Soluble Resin (A)

Examples of the alkali-soluble resin (A) (referred to as a component (A)) used for the photosensitive resin composition of the present invention may include (meth)acyl based resins, styrene based resins, epoxy based resins, amide based resins, amide epoxy based resins, alkyd based resins, phenol based resins, phenol novolak based resins and cresol novolak based resins. The (meth)acryl based resin is preferable in terms of alkali development property.

As the above (meth)aryl based resins, those obtained by polymerizing or copolymerizing monomers included below may be used. These monomers may also be combined as a component (B) described later. As such a monomer, for example, (meth)acrylate esters, ethylenically unsaturated carboxylic acids and other copolymerizable monomers may be used suitably. Specific examples may include styrene, benzyl (meth)acrylate, cyclohexyl (meth)acrylate, phenoxyethyl (meth)acrylate, phenoxy polyethylene glycol (meth)acrylate, nonylphenoxy polyethylene glycol mono(meth)acrylate, nonylphenoxy polypropylene mono(meth)acrylate, 2-hydroxy-3-phenoxypropyl acrylate, 2-acryloyloxyethyl phthalate, 2-acryloyloxyethyl-2-hydroxyethyl phthalate, 2-methacryloyloxyethyl-2-hydroxypropyl phthalate, methyl (meth)acrylate, ethyl (meth)acrylate, n-propyl (meth)acrylate, i-propyl (meth)acrylate, n-butyl (meth)acrylate, i-butyl (meth)acrylate, sec-butyl (meth)acrylate, tert-butyl (meth)acrylate, 2-hydroxyethyl (meth)acrylate, 2-hydroxypropyl (meth)acrylate, 3-hydroxypropyl (meth)acrylate, 2-hydroxybutyl (meth)acrylate, 3-hydroxybutyl (meth)acrylate, 4-hydroxybutyl (meth)acrylate, 3-ethylhexyl (meth)acrylate, ethylene glycol mono(meth)acrylate, glycerol (meth)acrylate, dipentaerythritol mono(meth)acrylate, dimethylaminoethyl (meth)acrylate, diethylaminoethyl (meth)acrylate, tetrahydrofurfuryl (meth)acrylate, glycidyl (meth)acrylate, 2,2,2-trifluoroethyl (meth)acrylate, 2,2,3,3-trifluoropropyl (meth)acrylate, (meth)acrylic acid, α-bromo(meth)acrylic acid, β-fulyl (meth)acrylic acid, crotonic acid, propiolic acid, cinnamic acid, α-cyanocinnamic acid, maleic acid, maleic acid anhydride, monomethyl maleate, monoethyl maleate, monoisopropyl maleate, fumaric acid, itaconic acid, itaconic acid anhydride, citraconic acid and citraconic acid anhydride. Among them, (meth)acrylic acid, methyl (meth)acrylate and styrene are suitably used.

Examples of other copolymerizable monomers may include fumarate esters, maleate esters, crotonate esters, and itaconate esters obtained by replacing acrylate with fumarate, maleate, crotonate and itaconate, respectively in the exemplified compounds of (meth)acrylate ester, α-methylstyrene, o-vinyltoluene, m-vinyltoluene, p-vinyltoluene, o-chlorostyrene, m-chlorostyrene, p-chlorostyrene, o-methoxystyrene, m-methoxystyrene, p-methoxystyrene, vinyl acetate, vinyl butyrate, vinyl propionate, (meth)acrylamide, (meth)acrylonitrile, isoprene, chloroprene, 3-butadiene and vinyl-n-butyl ether.

In addition to the polymers/copolymers of the above monomers, it is possible to use cellulose derivatives such as cellulose, hydroxymethylcellulose, hydroxyethylcellulose, hydroxypropylcellulose, carboxymethylcellulose, carboxyethylcellulose and carboxyethylmethylcellulose, and additionally copolymers of these cellulose derivatives with the ethylenically unsaturated carboxylic acids or the (meth)acrylate compounds. Furthermore, polyvinyl alcohols such as a polybutyral resin which is a reaction product of polyvinyl alcohol and butylaldehyde, polyesters obtained by ring-opening and polymerizing lactones such as δ-valerolactone, ε-caprolactone, β-propiolactone, α-methyl-β-propiolactone, β-methyl-β-propiolactone, α-methyl-β-propiolactone, β-methyl-β-propiolactone, α,α-dimethyl-β-propiolactone and β,β-dimethyl-β-propiolactone, polyesters obtained by condensation reactions of diols of one or more alkylene glycols such as ethylene glycol, propylene glycol, diethylene glycol, triethylene glycol, dipropylene glycol and neopentyl glycol with dicarboxylic acids such as maleic acid, fumaric acid, glutaric acid and adipic acid, polyethers such as polyethylene glycol, polypropylene glycol, polytetramethylene glycol and polypentamethylene glycol, polycarbonates which are reaction products of diols such as bisphenol A, hydroquinone and dihydroxycyclohexane with carbonyl compounds such as diphenyl carbonate, phosgene and succinic acid anhydride may be included. The above component (A) may be used alone or in combination of two or more.

It is preferable to contain a carboxyl group in the above component (A) from the standpoints of the alkali development property. Such a component (A) may be produced by performing radical polymerization of a monomer having the carboxyl group with another monomer. In this case, it is preferable to contain (meth)acrylic acid.

Photopolymerizable Compound (B)

The photopolymerizable compound (B) (component (B)) of the present invention is characterized by having at least one polymerizable ethylenically unsaturated group in a molecule. An amount of the component (B) to be combined is 10 to 200 parts by weight, preferably 30 to 150 parts by weight, and more preferably 50 to 120 parts by weight based on 100 parts by weight of the component (A) solid content.

The component (B) preferably contains a compound (B-1) obtained by reacting α,β-unsaturated carboxylic acid with polyhydric alcohol. By containing the (B-1), the sensitivity is increased. Examples of the above α,β-unsaturated carboxylic acid may suitably include, but are not limited to, (meth)acrylic acid.

Examples of the above compound (B-1) obtained by reacting α,β-unsaturated carboxylic acid with polyhydric alcohol may include polyalkylene glycol di(meth)acrylate, ethylene glycol di(meth)acrylate, propylene glycol di(meth)acrylate, polyethylene polytrimethylolpropane di(meth)acrylate, trimethylolpropane tri(meth)acrylate, trimethylolpropane ethoxy tri(meth)acrylate, trimethylolpropane diethoxy tri(meth)acrylate, trimethylolpropane triethoxy tri(meth)acrylate, trimethylolpropane tetraethoxy tri(meth)acrylate, trimethylolpropane pentaethoxy tri(meth)acrylate, tetramethylolmethane tri(meth)acrylate, tetramethylolmethane tetra(meth)acrylate, tetramethylolpropane tetra(meth)acrylate, pentaerythritol tri(meth)acrylate, pentaerythritol tetra(meth)acrylate, pentaerythritol penta(meth)acrylate, dipentaerythritol penta(meth)acrylate, and dipentaerythritol hexa(meth)acrylate. These compounds may be used alone or in combination of two or more.

The above polyalkylene glycol di(meth)acrylate may include polyethylene glycol di(meth)acrylate, polypropylene glycol di(meth)acrylate and ethoxylated polypropylene glycol di(meth)acrylate. Among them, polyalkylene glycol di(meth)acrylate whose molecular weight is in the range of 500 to 2,000 is suitably used because the tent strength is enhanced. A specific suitable example may include ethoxylated polypropylene glycol di(meth)acrylate.

The amount of the above (B-1) to be combined is preferably 10 to 100 parts by weight, and more preferably 30 to 90 parts by weight based on 100 parts by weight of the component (A) solid content.

The component (B) used for the present invention may further contain a compound (B-2) having a bisphenol skeleton. By containing the (B-2), the stability for light and heat is enhanced.

Examples of the above compound (B-2) having the bisphenol skeleton may include bisphenol A type compounds, bisphenol F type compounds and bisphenol S type compounds. In the present invention, 2,2-bis[4-{(meth)acryloxypolyethoxy}phenyl]propane is preferably included in the bisphenol A type compounds. Specific examples may include, but are not limited to, 2,2-bis[4-{(meth)acryloxydiethoxy}phenyl]propane, 2,2-bis[4-{(meth)acryloxytriethoxy}phenyl]propane, 2,2-bis[4-{(meth)acryloxypentaethoxy}phenyl]propane and 2,2-bis[4-{(meth)acryloxydecaethoxy}phenyl]propane. These compounds may be used alone or in combination of two or more. 2,2-Bis[4-(methacryloxypentaethoxy)phenyl]propane is commercially available as "BPE-500" (Shin-Nakamura Chemical Co., Ltd.) and suitably used.

The amount of the above (B-2) to be combined is preferably 10 to 100 parts by weight, and more preferably 30 to 90 parts by weight based on 100 parts by weight of the component (A) solid content.

The component (B) used for the present invention may contain 2-phenoxy-2-hydroxypropyl (meth)acrylate, 2-(meth)acryloyloxy-2-hydroxypropyl phthalate, 2-(meth)acryloyloxyethyl-2-hydroxyethyl phthalate, compounds obtained by reacting α,β-unsaturated carboxylic acid with glycidyl group-containing compounds, urethane monomers, nonylphenyldioxylene (meth)acrylate, γ-chloro-β-hydroxypropyl-β'-(meth)acryloyloxyethyl-o-phthalate, β-hydroxyethyl-β'-(meth)acryloyloxyethyl-o-phthalate, β-hydroxypropyl-β'-(meth)acryloyloxyethyl-o-phthalate, and (meth)acrylic acid alkyl ester. Additionally, the monomers exemplified as being capable of combining in the above component (A) may be contained.

Examples of the above glycidyl group-containing compounds may include, but are not limited to, triglycerol di(meth)acrylate.

Examples of the above urethane monomers may include addition reaction products of (meth)acryl monomer having an OH group at position P with isophorone diisocyanate, 2,6-toluene diisocyanate, 2,4-toluene diisocyanate or 1,6-hexamethylene diisocyanate, tris[(meth)acryloxy tetraethylene glycol isocyanate]hexamethylene isocyanate, EO-modified urethane di(meth)acrylate and EO-, PO-modified urethane di(meth)acrylate.

Examples of the above (meth)acrylic acid alkyl ester may include (meth)acrylic acid methyl ester, (meth)acrylic acid ethyl ester, (meth)acrylic acid butyl ester and (meth)acrylic acid 2-ethylhexyl ester.

The amount of the component (B) (solid content) to be combined is preferably 20 to 60 parts by weight based on 100 parts by weight of a total amount of the component (A) and the component (B). When the amount of the component (B) is too small, the sensitivity is reduced whereas when it is too large, a film forming property is inferior.

Photopolymerization Initiator (C)

The photopolymerization initiator (C) (component (C)) used for the present invention is characterized by comprising at least the hexaarylbisimidazole based compound (C1) and the multifunctional thiol compound (C2) as essential components. By having the hexaarylbisimidazole based compound (C1), particularly, effects excellent in adhesion and resolution may be obtained.

The hexaarylbisimidazole based compound (C1) (referred to as an essential component (C1)) used for the invention means a dimer compound of imidazole where all hydrogen atoms bound to three carbon atoms of an imidazole ring have been substituted with aryl groups (included substituted and unsubstituted ones). Specific examples thereof may include 2,4,5-triarylimidazole dimer such as 2-(o-chlorophenyl)-4,5-diphenylimidazole dimer, 2-(o-chlorophenyl)-4,5-di(methoxyphenyl)imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer and 2,4,5-triarylimidazole dimer, 2,2-bis(2,6-dichlorophenyl)-4,5-diphenylimidazole dimer, 2,2'-bis(o-chlorophenyl)-4,4',5,5'-tetra(p-fluorophenyl)biimidazole, 2,2'-bis(o-bromophenyl)-4,4',5,5'-tetra(p-iodephenyl)biimidazole, 2,2'-bis(o-chlorophenyl)-4,4',5,5'-tetra(p-chloronaphthyl)biimidazole, 2,2'-bis(o-chlorophenyl)-4,4',5,5'-tetra(p-chlorophenyl)biimidazole, 2,2'-bis(o-bromophenyl)-4,4',5,5'-tetra(p-chloro-p-methoxyphenyl)biimidazole, 2,2'-bis(o-chlorophenyl)-4,4',5,5'-tetra(o,p-dichlorophenyl)biimidazole, 2,2'-bis(o-chlorophenyl)-4,4',5,5'-tetra(o,p-dibromophenyl)biimidazole, 2,2'-bis(o-bromophenyl)-4,4',5,5'-tetra(o,p-dichlorophenyl)biimidazole, and 2,2'-bis(o,p-dichlorophenyl)-4,4',5,5'-tetra (o,p-dichlorophenyl)biimidazole. Among them, the 2-(o-chlorophenyl)-4,5-diphenylimidazole dimer is preferably used.

The multifunctional thiol compound (C2) (hereinafter referred to as the essential component (C2)) is a compound having two or more thiol groups in a molecule, and particularly, an aliphatic multifunctional thiol compound having multiple thiol groups in an aliphatic group is preferable. Among them, the aliphatic multifunctional thiol compound having a large molecular weight and low vapor pressure is preferable.

Examples of the aliphatic multifunctional thiol compound used for the present invention may include hexanedithiol, decanedithiol, 1,4-dimethylmercaptobenzene, butanediol bisthiopropionate, butanediol bisthioglycolate, ethylene glycol bisthioglycolate, trimethylolpropane tris thioglycolate, butanediol bisthiopropionate, trimethylolpropane tris thiopropionate, trimethylolpropane tris thioglycolate, pentaerythritol tetrakis thiopropionate, pentaerythritol tetrakis thioglycolate, tris hydroxyethyl tris thiopropionate, and additionally thioglycolate and thiopropionate of polyvalent hydroxy compounds. Among them, trimethylolpropane tris thiopropionate and pentaerythritol tetrakis thioglycolate are suitably used. The component (C) may drastically enhance the sensitivity by containing the essential component (C2) without impairing an image property such as resolution and causing surface deterioration in the development.

The amount of the above component (C) to be combined in the composition is 0.1 to 30 parts by weight based on 100 parts by weight of the component (A) solid content. When the amount is less than 0.1 parts by weight, the sensitivity is reduced and practicability is poor. Conversely when it exceeds 30 parts by weight, the adhesion is reduced. The amount of the essential component (C2) to be combined is 0.1 to 30 parts by weight, preferably 1 to 20 parts by weight and more preferably 1 to 10 parts by weight based on 100 parts by weight of the essential component (C1). When the amount of the essential component (C2) is less than 0.1 parts by weight, the sensitivity is excessively low whereas when it exceeds 30 parts by weight, the resolution and storage stability with time are deteriorated.

It is preferable that the photosensitive resin composition further contains n-phenylglycine as the component (C). Because the sensitivity is enhanced by containing n-phenylglycine.

When the component (C) contains n-phenylglycine, the amount of n-phenylglycine to be combined is preferably 3 to 20 parts by weight and more preferably 5 to 15 parts by weight based on 100 parts by weight of its essential component (C1). When the amount is less than 3 parts by weight, no effect of the enhanced sensitivity is likely observed whereas when it exceeds 20 parts by weight, the resolution and the storage stability with time are deteriorated.

The photosensitive resin composition of the present invention may include the photopolymerization initiator in addition to those described above as long as the effects of the invention are not disturbed. Examples of such a photopolymerization initiator may include aromatic ketone such as benzophenone, N,N'-tetramethyl-4,4'-diaminobenzophenone, N,N'-tetraethyl-4,4'-diaminobenzophenone, 4-methoxy-4'-dimethylaminobenzophenone, 2-benzyl-2-dimethylamino-1-(4-morpholinophenyl)-butanone-1,2-methyl-1-[4-(methylthio)phenyl]-2-morpholino-propanone-1; quinones such as 2-ethylanthraquinone, phenanthrenequinone, 2-tert-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone and 2,3-dimethylanthraquinone; benzoin ether compounds such as benzoinmethyl ether, benzomethyl ether and benzoinphenyl ether; benzoin compounds such as benzoin, methylbenzoin and ethylbenzoin; benzyl derivatives such as benzylmethylketal; acridine derivatives such as 9-phenylacridine and 1,7-bis(9,9'-acridinyl)heptane, and coumarin based compounds.

Other Components

In the present invention, organic solvents for dilution such as alcohols, ketones, acetic acid esters, glycol ethers, glycol ether esters and petroleum based solvents may be added appropriately for the purpose of adjusting a viscosity if necessary in addition to the above components.

Examples of the above organic solvent for the dilution may include, but are not limited to, hexane, heptane, octane, nonane, decane, benzene, toluene, xylene, benzyl alcohol, methyl ethyl ketone, acetone, methyl isobutyl ketone, cyclohexane, methanol, ethanol, propanol, butanol, hexanol, cyclohexanol, ethylene glycol, diethylene glycol, glycerine, ethylene glycol monomethyl ether, ethylene glycol monoethyl ether, propylene glycol monomethyl ether, propylene glycol monoethyl ether, diethylene glycol monomethyl ether, diethylene glycol monoethyl ether, diethylene glycol dimethyl ether, diethylene glycol diethyl ether, 2-methoxybutyl acetate, 3-methoxybutyl acetate, 4-methoxybutyl acetate, 2-methyl-3-methoxybutyl acetate, 3-methyl-3-methoxybutyl acetate, 3-ethyl-3-methoxybutyl acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, methyl lactate, ethyl lactate, methyl acetate, ethyl acetate, propyl acetate, butyl acetate, propylene glycol monomethyl ether acetate, propylene glycol monoethyl ether acetate, methyl propionate, ethyl propionate, methyl benzoate, ethyl benzoate, propyl benzoate, butyl benzoate, methyl butyrate, ethyl butyrate, propyl butyrate, and additionally petroleum based solvents available under trade names such as "Swasol" (Maruzen Petrochemical Co., Ltd.) and "Solvets" (Tonen Petrochemical Co., Ltd.).

Other additives such as coloring dyes, adhesion imparting agents, plasticizers, antioxidants, heat polymerization inhibitors, surface tension modifiers, stabilizers, chain transfer agents, anti-foaming agents and flame retardants may also be added appropriately. When the antioxidant is added, the stability for light and heat is prone to be enhanced.

The most preferable combination of the above components (A), (B) and (C) as the photosensitive resin component of the present invention is obtained by combining 100 parts by weight (in terms of solid content) of a resin with weight-average molecular weight of 80,000 obtained by copolymerizing methyl methacrylate, methacrylic acid and styrene at a weight ratio of 50:25:25 as the component (A), 40 parts by weight of ethoxylated polypropylene glycol dimethacrylate (B-1) and 40 parts by weight of 2,2-bis[4-(methacryloxy polyethoxy)phenyl]propane as the component (B), and 10 parts by weight of 2,2'-bis(2-chlorophenyl)-4,4',5,5'-tetraphenyl-1,2'-biimidazole and 0.2 parts by weight of trimethylol propane tris thiopropionate (TMMP) as the component (C). This combination is entirely excellent in sensitivity, stability, tent strength, resolution and plating non-staining.

The preferable combination of the above components (A), (B) and (C) in the light of using for the actual production is obtained by combining the (meth)acryl based resin as the component (A), ethoxylated polypropylene glycol dimethacrylate as the component (B), and 2,2'-bis(2-chlorophenyl)-4,4',5,5'-tetraphenyl-1,2'-biimidazole and trimethylol propane tris thiopropionate (TMMP) as the component (C). This combination is well-balanced in production cost and effects.

Photosensitive Dry Film

Subsequently, the photosensitive dry film of the present invention will be described. The photosensitive dry film of the invention is obtained by at least providing the photosensitive resin layer formed from the aforementioned photosensitive resin composition on a support film. When used, the photosensitive resin layer may be provided easily on a material to be treated (substrate) by lapping the revealing photosensitive resin layer over the material to be treated (substrate) and subsequently peeling the support film from the photosensitive resin layer.

By the use of the photosensitive dry film of the present invention, the layer having more excellent film thickness uniformity and surface smoothness may be formed compared to the case of forming the photosensitive resin layer by directly applying the photosensitive resin composition onto the material to be treated (substrate).

The support film used for producing the photosensitive dry film of the present invention is not particularly limited as long as the photosensitive resin layer formed as a film on the support film can be peeled easily from the support film, which is a mould releasing film capable of transferring the layer onto a surface to be treated of glass and the like. Examples of such a support film may include flexible films composed of films of synthetic resins such as polyethylene terephthalate, polyethylene, polypropylene, polycarbonate and poly vinyl chloride with a film thickness of 15 to 125 µm. It is preferable that a mould releasing treatment is given to the above support film if necessary to easily transfer.

When the photosensitive resin layer is formed on the support film, the photosensitive resin composition of the present invention is prepared and the photosensitive resin composition of the invention is applied on the support film so that the dried film thickness is 10 to 100 µm using an applicator, a bar coater, a wire bar coater, a roll coater or a curtain flow coater. In particular, the roll coater is preferable because the film thickness uniformity is excellent and the thick film may be formed efficiently.

When the photosensitive resin layer is formed, the photosensitive resin composition of the present invention may be directly applied on the support film, but a water-soluble resin layer has been previously formed on the support film and the photosensitive resin composition of the invention may also be applied on this water-soluble resin layer to form the photosensitive resin layer. The water-soluble resin layer herein prevents tacky adhesion of a mask (pattern) attached firmly at the exposure as well as an oxygen desensitizing effect of the photosensitive resin. The water-soluble resin layer is formed by applying and drying an aqueous solution of 5 to 20% by weight of a water-soluble polymer such as polyvinyl alcohol or partially saponified polyvinyl acetate so that a dried film thickness is 1 to 10 µm using the bar coater, the roll coater or the curtain flow coater. It is preferable to add ethylene glycol, propylene glycol or polyethylene glycol into the above aqueous solution of the water-soluble polymer when this water-soluble resin layer is formed because the flexibility of the water-soluble resin layer is increased and the mould releasing property from the flexible film is enhanced.

When the thickness of the above water-soluble resin layer is less than 1 µm, poor exposure because of oxygen desensitization occurs in some cases whereas when it exceeds 10 µm, the resolution is prone to deteriorate. When the above aqueous solution is prepared, considering a viscosity of the solution and defoaming, the solvent such as methanol, ethylene glycol monomethyl ether or acetone, or a commercially available anti-foaming agent may be added.

In the photosensitive dry film of the present invention, a protective film may be further provided on the photosensitive resin layer. By being protected by the protective film, storage, transport and handling become easy. The photosensitive dry film protected by the protective film may be previously produced and stored for a predetermined period although there is an expiration date for use. Therefore, when the device having the wiring circuit is produced, the photosensitive dry film protected by the protective film may be used instantly, and a wiring circuit forming step may be made more efficient. As this protection film, polyethylene terephthalate film, polypropylene film and polyethylene film with a thickness of about 15 to 125 µm to which silicone has been coated or burned in are suitable.

Examples of methods of using the photosensitive dry film of the present invention may include, but are not limited to, the following example. The method will be described with reference to the following photosensitive dry film provided the protective film.

First, the protective film is peeled from the photosensitive dry film of the present invention, and the revealing photosensitive resin layer is placed on the material to be treated (substrate) to adhere the photosensitive resin layer onto the substrate. When adhered, typically a thermal compression mode in which the substrate has been previously heated and the photosensitive dry film placed thereon is pressed is employed.

Then, the photosensitive resin layer is selectively exposed by exposing the photosensitive resin layer laminated the support film through the mask or exposing a depiction directly. Specifically, ultraviolet light is irradiated using a low pressure mercury lamp, a high pressure mercury lamp, an ultra high pressure mercury lamp, an arc lamp, or a xenon lamp. The exposure may also be performed by irradiating h-ray, excimer laser, X-ray or electron beam. In particular, i-ray (365 nm) exposure by the laser is preferable.

After the above exposure, an unexposed area of the photosensitive resin layer is selectively removed by peeling the support film and developing to form a pattern where an exposed area of the photosensitive resin layer stays behind. Examples of a developing solution used for the development may include alkali developing solutions, i.e., aqueous solutions composed of hydroxide, carbonate, bicarbonate, phosphate and pyrophosphate salts of alkali metals such as lithium, sodium and potassium; primary amine such as benzylamine and butylamine; secondary amine such as dimethylamine, dibenzylamine and diethanolamine; tertiary amine such as trimethylamine, triethylamine and triethanolamine; cyclic amine such as morpholine, piperazine and pyridine;

polyamine such as ethylenediamine and hexamethylenediamine; ammonium hydroxides such as tetraethyl ammonium hydroxide, trimethylbenzyl ammonium hydroxide and trimethylphenylbenzyl ammonium hydroxide; and sulfonium hydroxides such as trimethyl sulfonium hydroxide, diethylmethyl sulfonium hydroxide and dimethylbenzyl sulfonium hydroxide; and additionally, alkali developing solutions commonly used such as buffers containing choline and silicate, and organic solvents commonly used, i.e., ketones such as acetone, methyl ethyl ketone, cyclohexane, methyl isoamyl ketone and 2-heptanone; polyhydric alcohols and derivatives thereof such as ethylene glycol, propylene glycol, diethylene glycol, ethylene glycol monoacetate, propylene glycol monoacetate, diethylene glycol monoacetate, or monomethyl ether thereof, monoethyl ether thereof, monopropyl ether thereof, monobutyl ether thereof or monophenyl ether thereof; and esters such as ethyl lactate, methyl acetate, ethyl acetate, butyl acetate, methyl pyruvate, ethyl pyruvate, methyl methoxypropionate and ethyl ethoxypropionate.

After the development, the resist pattern may be further cured by heating at about 60 to 250° C. or exposing at about 0.2 to 10 mJ/cm$^2$ if necessary.

Then, a metal wiring pattern is formed by etching the substrate using the patternized residual photosensitive resin layer (photoresist pattern) as the mask or plating a photoresist pattern-unformed area.

Thereafter, the photoresist pattern is peeled and removed by an aqueous solution at pH of about 12 to 14 of sodium hydroxide, potassium hydroxide or organic amines.

EXAMPLES

The present invention will be described in more detail with reference to the following Examples, but those Examples are only exemplifications for suitably illustrating the invention and do not limit the invention.

Examples 1 to 9

Photosensitive resin composition solutions were prepared by stirring and mixing the compounds in accordance with the compositions shown in Table 1. (A), (B) and (C) in the table represent the following compounds. In addition to the components described in Table 1, 60 parts by weight of methyl ethyl ketone was also used.

(A) Alkali-Soluble Resin

A resin with weight-average molecular weight of 80,000 obtained by copolymerizing methyl methacrylate, methacrylic acid and styrene at a weight ratio of 50:25:25 was used at 100 parts by weight in terms of solid content.

(B) Photopolymerizable Compound (B-1)

[1] Polypropylene Glycol Diacrylate (N; 12) "Alonics M270" (Trade Name, supplied from Toagosei Co., Ltd.)

[2] Ethoxylated polypropylene glycol dimethacrylate "Alonics M775" (trade name, supplied from Toagosei Co., Ltd.)

(B-2)

2,2-Bis[4-(methacryloxy polyethoxy)phenyl)propane "BPE500" (trade name, supplied from Shin-Nakamura Chemical Co., Ltd.)

(C) Photopolymerization Initiator (C1-1)

2,2'-Bis(2-chlorophenyl)-4,4',5,5'-tetraphenyl-1,2'-biimidazole "B-CIM" (trade name, supplied from Hodogaya Chemical Co., Ltd.)

(C1-2)

2,2'-Bis(2,6-dichlorophenyl)-4,4',5,5'-tetraphenyl-1,2'-biimidazole "TC-HABI" (trade name, supplied from Nihon SiberHegner K.K.)

(C2-1)

Trimethylolpropane tris thiopropionate (TMMP) (supplied from Sakai Chemical Industry Co., Ltd.)

(C2-2)

Pentaerythritol Tetrakis Thioglycol (PEMP) (supplied from Sakai Chemical Industry Co., Ltd.)

(C3)

n-Phenylglycine (supplied from Mitsui Chemicals Inc.)

(C4)

Tetra-n-butyl ammonium butyltri(4-methyl-1-naphthyl) borate (C5)

9-Phenylacridine

TABLE 1

| | Example 1 | Example 2 | Example 3 | Example 4 | Example 5 | Example 6 | Example 7 | Example 8 | Example 9 | Comparative Example 1 | Comparative Example 2 | Comparative Example 3 |
|---|---|---|---|---|---|---|---|---|---|---|---|---|
| (A) | 100 | 100 | 100 | 100 | 100 | 100 | 100 | 100 | 100 | 100 | 100 | 100 |
| (B-1) [1] | 80 | 80 | 80 | 80 | — | — | 80 | 80 | 80 | 80 | 80 | 80 |
| [2] | — | — | — | — | 80 | 40 | — | — | — | — | — | — |
| (B-2) | — | — | — | — | — | 40 | — | — | — | — | — | — |
| (C1-1) | 10 | 10 | 10 | 10 | 10 | 10 | — | 10 | 10 | — | 10 | 10 |
| (C1-2) | — | — | — | — | — | — | 10 | — | — | — | — | — |
| (C2-1) | 0.01 | 0.3 | — | 0.2 | 0.2 | 0.2 | 0.2 | 0.005 | 1.0 | 0.3 | — | — |
| (C2-2) | — | — | 0.3 | — | — | — | — | — | — | — | — | — |
| (C3) | — | — | — | 0.5 | 0.5 | 0.5 | 0.5 | — | — | — | — | — |
| (C4) | — | — | — | — | — | — | — | — | — | 10 | — | — |
| (C5) | — | — | — | — | — | — | — | — | — | — | — | 0.005 |
| Sensitivity | A | A | A | A | A | A | A | B | A | A | C | C |
| Stability | B | B | B | B | B | A | B | A | B | C | A | A |
| Tent Strength | B | B | B | B | A | A | B | B | B | B | B | B |
| Resolution | A | B | B | A | A | A | B | A | B | B | B | B |
| Plating Staining | A | A | A | A | A | A | A | A | B | B | A | A |

Each photosensitive dry film was obtained by uniformly applying a solution of the photosensitive resin composition on a PET film (thickness: 19 μm) "G2" (trade name, supplied from Teijin DuPont Films Japan Ltd.), drying in a batch mode hot wind dryer at 80° C. for about 10 minutes, and subsequently laminating a protective film "GF816" (trade name, supplied from Tamapoly Co., Ltd.) thereon. A film thickness of a dried photosensitive resin layer was 40 μm.

Subsequently, buffing was given to a copper-clad lamination with a copper thickness of 35 μm and a plate thickness of 1.6 mm, and the above each photosensitive dry film was laminated on the resulting copper-clad lamination at a roll temperature of 105° C., at a roll cylinder pressure of 3.0 kg/cm$^2$ and at a speed of 1.0 m/minute with peeling the protective film therefrom.

The sensitivity, the stability, the tent strength, the resolution and the plating staining of the photosensitive resin layer on the copper-clad lamination obtained as the above were evaluated. Each evaluation method is as follows.

Unless otherwise described below, the development was performed by spraying an aqueous solution of 1% by weight of $Na_2CO_3$ at 30° C. at a spraying pressure of 1.2 kg/cm$^2$ for 40 seconds.

Sensitivity Evaluation

Stouffer 21-step step tablet was placed as an exposure mask on the photosensitive dry film laminated by the above method, the photosensitive dry film was exposed at an exposure intensity of 10 mJ/cm$^2$, subsequently developed, and a minimum dimension of a residual adhesion/resolution (line & space) pattern was evaluated. "DP-100" (trade name, supplied from Orbotech Ltd.) was used as an exposure apparatus.

In Table 1, "A", "B" and "C" of the sensitivity evaluation represent SST 7 steps or more, SST 4 steps or more and SST 2 steps or less, respectively.

Stability Evaluation

The photosensitive dry film was laminated by the above method, subsequently left stand under a yellow lamp "FLR40SY-F/M" (trade name, supplied from Hitachi Ltd.), and changes of the sensitivity and the adhesion/resolution after 0, 2, 4, 6 and 8 hours were evaluated. A distance between the substrate and the yellow lamp was 50 cm. The dry film was left stand 50 cm under the yellow lamp at room temperature of 20° C. and at a humidity of 50% in a clean room in house of Tokyo Ohka Kogyo Co., Ltd.

In Table 1, the stability evaluation "A" represents no change of the sensitivity and the adhesion/resolution for 6 hours or more after leaving stand under the yellow lamp, "B" represents no change of the sensitivity and the adhesion/resolution for 4 hours after leaving stand under the yellow lamp, and "C" represents the changed sensitivity and adhesion/resolution even within 2 hours after leaving stand under the yellow lamp.

Tent Strength Evaluation

The buffing was given to a tent substrate (through hole diameter: diameter 6.0 mm), and then the photosensitive dry film was laminated on both sides thereof. Subsequently, the both side exposure was performed (exposure intensity: 10 mJ/cm$^2$), and the development was performed (for 40 seconds). Then, a resist film strength when broken was measured using Tensilon universal tensile testing machine (supplied from Orientec Co., Ltd., compression test scanning speed: 20 mm/minute, head diameter ϕ2 mm).

In Table 1, the tent strength evaluation "A", "B" and "C" represent the film strength of 300 g or more, the film strength of 200 g or more and less than 300 g, and the film strength of less than 200 g, respectively.

Resolution Evaluation

Laser exposure at an exposure intensity of 10 mJ/cm$^2$ was given to the photosensitive dry film laminated by the above method to patternize, subsequently the dry film was developed, and the minimum dimension of the residual adhesion/resolution (line & space) pattern was evaluated. The resolution evaluation (line & space) was performed using a test pattern supplied from Orbotech Ltd.

In Table 1, the resolution evaluation "A" represents being capable of reproducing a thin line of less than 50 μm, "B" represents being capable of reproducing a thin line of 50 μm or more and less than 100 μm, and "C" represents being incapable of reproducing a thin line of 100 μm or more. Being capable of reproducing the thin line means that there is no wave and deflection in line and space areas after the development.

Plating Staining Evaluation

The photosensitive dry film was exposed at 5 mJ/cm$^2$, and subsequently immersed in a plating solution (room temperature) to make a fatigue plating solution. Then, a Hull cell test was performed, and a tin ratio and a solder plating thickness were measured using a fluorescence X-ray apparatus to evaluate a state after the plating. The Hull cell test is a test to evaluate overs and shorts of a main component and contamination of impurities in a plating solution by placing a solder tin plating solution in a Hull cell and plating at a current of 1 A and at a stirring speed of 400 rpm for 10 min.

In Table 1, the plating staining evaluation "A" represents almost no change (no staining) in tin ratio and solder plating thickness, "B" represents a slight change in tin ratio and solder plating thickness, and "C" represents a notable change in tin ratio and solder plating thickness.

As a result, as shown in Table 1, the sensitivity evaluation of the photosensitive dry film of the present invention was A or B, which was preferable. Also, the stability evaluation thereof was A or B, which was preferable. The other evaluations (tent strength, resolution and plating staining) were also preferable. The cases of combining 0.1 to 10 parts by weight of the essential component (C2) based on 100 parts by weight of the essential component (C1) (Examples 1 to 7, 9) exhibited more preferable sensitivity "A" than the case combining the essential component (C2) out of the above range (Example 8). The case which exhibited the most excellent effects among Examples was the case (Example 6) of combining 40 parts by weight of ethoxylated polypropylene glycol dimethacrylate (B-1) and 40 parts by weight of 2,2-bis[4-(methacryloxy polyethoxy)phenyl]propane (B-2) as the component (B), 10 parts by weight of 2,2'-bis(2-chlorophenyl)-4,4',5,5'-tetraphenyl-1,2'-bisimidazole (C1-1) and 0.2 parts by weight of trimethylolpropane tris (C2-1) as the component (C).

Comparative Examples 1 to 3

The compounds in accordance with the composition shown in the above Table 1 were stirred and mixed to prepare the photosensitive resin composition, and the dry film was made by the same way as in Example 1. Then, each evaluation of the dry film was performed by the same way as in Example 1.

As a result, as shown in the above Table 1, in Comparative Example 1 in which the essential component (C1) had not been contained, the stability evaluation was "C", which was considered to be unsuitable for actual use. In Comparative Examples 2 and 3 in which the essential component (C2) had not been contained, the sensitivity evaluation was "C", which was considered to be unsuitable for actual use.

INDUSTRIAL APPLICABILITY

As in the above, the photosensitive resin composition and the photosensitive dry film of the present invention are excellent in both sensitivity and stability, and are well-balanced in various properties such as tent strength, resolution and plating non-staining. Therefore, the invention is useful for the patterning of resists by the ultraviolet light exposure, particularly the formation of the wiring circuit using the laser direct imaging (LDI).

The invention claimed is:

1. A photosensitive resin composition comprising:
an alkali-soluble resin (A);
a photopolymerizable compound (B); and
a photopolymerization initiator (C),
wherein said photopolymerizable compound (B) comprises a polyalkylene glycol di(meth)acrylate having a molecular weight in the range of 500 to 2,000 (B-1) and a compound having a bisphenol skeleton (B-2),
an amount of the compound (B-1) to be combined is 30 to 90 parts by weight based on 100 parts by weight of the component (A) solid content, and
an amount of the compound (B-2) to be combined is 30 to 90 parts by weight based on 100 parts by weight of the component (A) solid content,
wherein said photopolymerization initiator (C) comprises a hexaarylbisimidazole based compound (C1) and an aliphatic multifunctional thiol compound having a plurality of aliphatic thiol groups (C2) as essential components,
wherein an amount of the essential component (C2) to be combined is 1 to 10 parts by weight based on 100 parts by weight of the essential component (C1) of said photopolymerization inhibitor (C).

2. The photosensitive resin composition according to claim 1, further comprising n-phenylglycine as said photopolymerization initiator (C).

3. The photosensitive resin composition according to claim 1, wherein said photosensitive resin composition is for laser scanning exposure.

4. A photosensitive dry film having at least a photosensitive resin layer formed from the photosensitive resin composition according to claim 1 on a support film.

5. The photosensitive dry film according to claim 4, wherein said photosensitive dry film is for laser scanning exposure.

* * * * *